March 5, 1968 AKIO YAMASHITA 3,372,317

PHOTOELECTRIC DEVICE

Original Filed March 10, 1964

AKIO YAMASHITA
INVENTOR

BY Stevens, Davis, Miller & Mosher
ATTORNEYS

United States Patent Office 3,372,317
Patented Mar. 5, 1968

3,372,317
PHOTOELECTRIC DEVICE

Akio Yamashita, Ikeda-shi, Japan, assignor to Matsushita Electric Industrial Co., Ltd., Osaka, Japan, a corporation of Japan Original application Mar. 10, 1964, Ser. No. 350,833. Divided and this application May 11, 1966, Ser. No. 566,698
5 Claims. (Cl. 317—235)

ABSTRACT OF THE DISCLOSURE

A semiconductor device for converting and/or controlling an electrical input, comprising successive layers of a first semiconductor, a mixture of a first electrical insulator and a second semiconductor, a second electrical insulator, a photosensitive member, and a transparent electrode.

The present application is a division of my application Ser. No. 350,833, filed Mar. 10, 1964, and now Patent No. 3,307,089.

The present invention relates to electrical devices, and more particularly to a semiconductor device which comprises a semiconductor brought into contact with a mixture of an electrical insulator and another semiconductor showing the effect of storing charges of single polarity.

Heretofore, there has been proposed a thin film active element in which a semiconductor is brought into contact with an electrical insulator so as to take advantage of a tunnel effect or a field effect transistor which takes full advantage of a P-N junction. There has also been proposed a thin film transistor which includes cadmium sulfide brought into contact with an electrical insulator. Any of these devices, however, takes advantage of the field effect and an inorganic material such as SiO is solely used as the insulator incorporated therein.

The primary object of the invention is to provide a semiconductor device which offers new and improved means and method of converting and controlling an electrical signal or electrical energy, and which comprises a mixture of at least a semiconductor and an electrical insulator, another semiconductor brought into contact with the mixture, and a transparent electrode indirectly disposed over the mixture on the opposite side of the another semiconductor through another electrical insulator and a photosensitive member applied on said another electrical insulator.

Another object of the invention is to provide a semiconductor device of said character in which the photosensitive layer is a layer including at least a fluorescent body therein and interposed between the insulating layer and the electrode of transparent nature whereby to effect conversion and control of an electrical signal or electrical energy by means of light.

Yet, another object of the invention is to provide a semiconductor device of said character in which the photosensitive layer is a layer including at least a photoconductor therein and interposed between the insulating layer and the transparent electrode to effect conversion and control of an electrical signal or electrical energy by means of light.

Still another object of the invention is to provide a semiconductor device of said character in which a rectifying layer is provided on the another semiconductor to obtain a new and improved means and method of converting and controlling an electrical signal or electrical energy.

There are other objects and particularities of the invention which will become obvious from the following description with reference to the accompanying drawings, in which.

The invention will now be described in detail with reference to the drawings.

Figure 1:
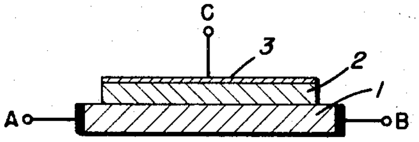
FIG. 1 is a schematic sectional view of a prior semiconductor device.

The afore-described thin film active element of prior design based on the tunnel effect utilizes a flow of carriers through an insulator, while other conventional devices invariably have three electrode terminals as shown in FIG. 1. The conventional device shown in FIG. 1 comprises a semiconductor 1, an electrical insulator or a P- or N-type semiconductor layer 2 depending on a thin film transistor or a field effect transistor and an electrode 3. A source electrode A and a drain electrode B are disposed on opposite sides of the transistor 1, while symbol C denotes a gate electrode. In either the thin film transistor or the field effect transistor, a flow of carriers between the electrodes A and B is controlled by an electric field across the electrodes A and C.

According to the invention, however, a mixture of at least a semiconductor and an electrical insulator is used in place of the insulator or the P- or N-type layer employed in the prior device shown in FIG. 1.

The semiconductor device of the invention is characterized by its unique structure in which such mixture of at least a semiconductor and an insulator is brought into contact with another semiconductor. The semiconductor forming one component of the mixture is a well-known material such as Se, $Cu_2O$, NiO, ZnO, PbO, CdS, Si, ZnSe or anthracene, and the insulator forming another component of the mixture is such a material as glass, porcelain, sulfur, silicone resin, polyvinyl chloride, polyvinyl acetate, epoxy resin, polyvinyl butyral or wax. Various methods may be considered to prepare the mixture from these materials. One of the methods is to mix the semiconductor with the insulator of organic nature such as the resin or wax, while another method in to mix the simiconductor with the insulator of inorganic nature such as glass, porcelain or sulfur. Further, a fluorescent body such as ZnS, (Zn, Cd)S or $ZnSiO_4$ or a ferroelectric substance such as $BaTiO_3$ or $SrTiO_3$ may be added to the mixture. Still further, a metal which develops a photovoltaic effect through contact with the semiconductor in the mixture may be added to the mixture.

Hereinunder, description will be made with regard to basic properties of a mixture of a semiconductor and an insulator. When D.C. voltage is applied to a common insulator in contact with an electrode, an electric charge of the opposite polarity to that of the electrode is produced as the surface of the insulator at which it is in contact with the electrode. When, however, D.C. voltage is applied to a mixture of a semiconductor and an insulator, an electric charge of the same polarity with that of an electrode with which the mixture is in contact is stored in the mixture.

It is possible to vary an amount of charge by illumination when a fluorescent layer or a layer including a fluorescent body is stacked on the insulator layer.

Figure 2:
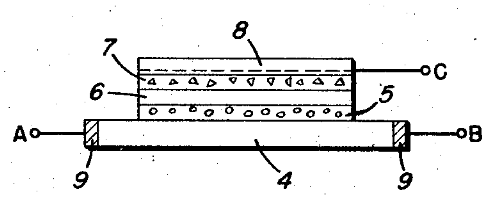
FIG. 2 is a schematic sectional view showing a basic form of the semiconductor device of the invention.
Figure 3:
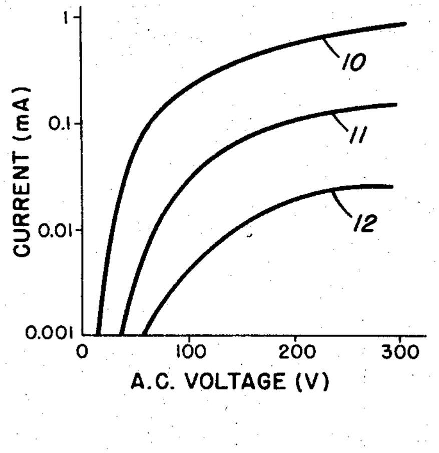

The stack having such characteristic is brought into contact with a semiconductor to provide a structure as shown in FIG. 2 wherein reference numerals 4, 5, 6, 7, 8 and 9 denote the semiconductor, the mixture of the semiconductor and the insulator, the insulator, the mixture of the fluorescent body and the insulator, the transparent electrode and the metal electrodes. When, in this arrangement, A.C. voltage at 30 kilocycles is applied across terminals A and C, current is caused to flow across terminals A and B. FIG. 3 shows a variation of the current relative to the A.C. voltage. A curve 10 therein indicates the characteristic in a dark space, while curves 11 and 12 indicate the characteristic when illuminated with light of 20 and 40 luxes simultaneously with the application of voltage, respectively. From FIG. 3, it will be seen that an electromotive force induced across the terminals A and B can be varied by the light.

A photoconductive layer or a layer including a photoconductor therein may be stacked on the insulator layer in lieu of the fluorescent layer in order to also vary an amount of charge by illumination. The fluorescent layer in the structure of FIG. 2 is now replaced by a photoconductive layer which comprises powder of cadmium sulfide dispersed in silicone resin. This photoconductive layer is coated to a thickness of about 60 microns on a plate of transparent conductive glass. A polyethyleneterephthalate film of 12 microns thick is adhered onto the photoconductive layer, and a mixture including powdered $Cu_2O$ dispersed in silicone resin is coated on the Mylar film to a thickness of 60 microns. D.C. and A.C. voltages are applied in super-imposed relation across terminal C on the transparent conductive glass electrode and terminal A on the electrode. The A.C. voltage at 100 volts, 60 cycles per second is applied in a manner that the terminal B becomes positive.

Figure 5:
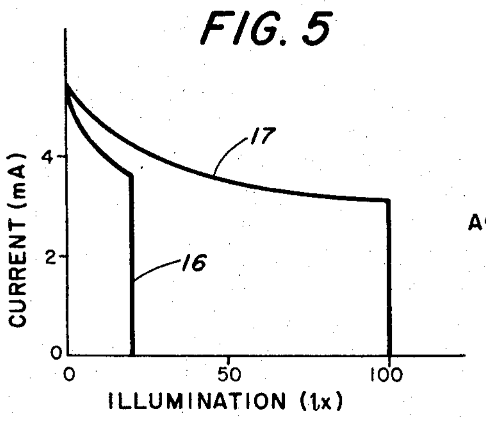
FIGS. 3–5 are graphic illustrations of various characteristics of the device of FIG. 2.
Figure 4:
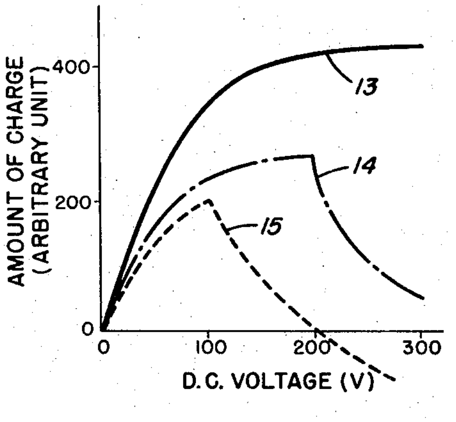

A curve 13 in FIG. 4 indicates a relation between D.C. voltage and an amount of charge in the mixture in the device just described which is placed in a dark space. It will be seen that, in the dark space, an increase in the D.C. voltage results in a corresponding increase in the amount of charge having the same polarity with that of the electrode. Meanwhile, curves 14 and 15 indicate the characteristic when the voltages are similarly applied under exposure with light of 20 and 100 luxes, respectively. It will be seen that the amount of charge increases at first with the increase of the D.C. voltage, but abruptly decreases at a certain voltage. When, with this arrangement, illumination of light is varied under application of A.C. voltage of 100 volts and D.C. voltage of 200 volts across the terminals A and C, current caused by an electromotive force induced across the terminals A and B varies as shown by a curve 16 in FIG. 5. It will be seen that the current abruptly decreases at the illumination of 20 luxes. When, on the other hand, the illumination is varied with the impression of A.C. voltage of 100 volts and D.C. voltage of 100 volts, the currents varies as shown by a curve 17 in FIG. 5. In this case, the current makes an abrupt decrease at the illumination of 100 luxes. It will be apparent that such device can effectively be utilized as a light switch.

Although the P-N junction is employed herein, it will be understood that the similar effect may be obtained when, for example, a gold wire is brought into point or rectifying contact with a semiconductor such as Si or Ge. To effect of the invention may be the same when a compound semiconductor such as GaAs is used instead of Si and Ge. GaAs is especially advantageous in that it can be used up to an ultra-high frequency range.

From the foregoing detailed description, it will be understood that semiconductor devices of various novel functions can be derived from the basic constitution of the invention comprising a mixture of a semiconductor and an insulator brought into contact with a semiconductor. The embodiments described in the invention are merely illustrative and various changes and modification may be made without departing from the spirit of the invention.

What is claimed is:

1. A semiconductor device comprising a first semiconductor, at least first and second metal electrodes contacting said first semiconductor, a mixture of at least a second semiconductor and a first electrical insulator disposed on said first semiconductor, a second electrical insulator disposed on said mixture, a photosensitive member disposed on said second electrical insulator, and a transparent electrode disposed on said photosensitive member, voltage means applied across said first electrode and said transparent electrode for producing an output across said first and second electrodes, where said output is varied by incident light through said transparent electrode.

2. A semiconductor device according to claim 1 in which said voltage means is an A.C. voltage.

3. A semiconductor device according to claim 1 in which said voltage means is a D.C. and an A.C. voltage in superimposed relation.

4. A semiconductor device according to claim 1 in which said photosensitive member is composed of at least a fluorescent material.

5. A semiconductor device according to claim 1 in which said photosensitive member is composed of at least a photoconductive material.

References Cited

UNITED STATES PATENTS

| | | | |
|---|---|---|---|
| 2,836,766 | 5/1958 | Halsted | 315—151 |
| 2,870,342 | 1/1959 | Walker | 250—213 |
| 3,265,899 | 9/1966 | Bergstrom | 250—211 |

OTHER REFERENCES

J. Wiley and Sons: Preparation and Characteristics of Solid Luminescent Materials, Cornell Symposium, Oct. 24–26, 1946, pp. 182–184.

N. Hannay: Semiconductors, Rheinhold Publishing Co., New York, 1959, pp. 577–580 relied on.

JOHN W. HUCKERT, *Primary Examiner.*

M. EDLOW, *Assistant Examiner.*